(12) United States Patent
Sato

(10) Patent No.: US 11,513,165 B2
(45) Date of Patent: Nov. 29, 2022

(54) POWER SEMICONDUCTOR MODULE AND LEAKAGE CURRENT TEST METHOD FOR THE SAME

(71) Applicant: FUJI ELECTRIC CO., LTD., Kawasaki (JP)

(72) Inventor: Tadahiko Sato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 173 days.

(21) Appl. No.: 16/889,144

(22) Filed: Jun. 1, 2020

(65) Prior Publication Data

US 2021/0011090 A1 Jan. 14, 2021

(30) Foreign Application Priority Data

Jul. 11, 2019 (JP) .............................. JP2019-129676

(51) Int. Cl.
*G01R 31/40* (2020.01)
*H02M 3/158* (2006.01)
*G01R 31/52* (2020.01)
*H02M 1/08* (2006.01)
*H02M 1/00* (2006.01)

(52) U.S. Cl.
CPC ............. *G01R 31/40* (2013.01); *G01R 31/52* (2020.01); *H02M 1/08* (2013.01); *H02M 3/1588* (2013.01); *H02M 1/0009* (2021.05)

(58) Field of Classification Search
CPC .... G01R 31/40; G01R 31/52; G01R 31/2621; G01R 31/2644; H02M 1/08; H02M 3/1588; H02M 1/0009; H02M 3/33592; H02M 1/32; Y02B 70/10

USPC ................................... 324/762.01, 537, 500
See application file for complete search history.

(56) References Cited

U.S. PATENT DOCUMENTS

| | | | | | |
|---|---|---|---|---|---|
| 3,213,299 | A | * | 10/1965 | Rogers ................. | H03H 11/245 330/277 |
| 3,248,892 | A | * | 5/1966 | Sutton .................... | G05D 23/24 62/156 |
| 3,526,809 | A | * | 9/1970 | Obenhaus .............. | H02H 3/085 361/24 |
| 3,577,074 | A | * | 5/1971 | Praglin .................. | G01N 30/66 324/706 |

(Continued)

FOREIGN PATENT DOCUMENTS

JP 2013-13051 A 1/2013

*Primary Examiner* — Giovanni Astacio-Oquendo

(57) ABSTRACT

A power semiconductor module including at least first and second power semiconductor elements, includes a first terminal, a first gate terminal, a second terminal, a second gate terminal, a third terminal and a common terminal. The first terminal connected to a first electrode of the first power semiconductor element. The first gate terminal connected to a gate of the first power semiconductor element. The second terminal connected to a first electrode of the second power semiconductor element. The second gate terminal connected to a gate of the second power semiconductor element. The third terminal connected to a second electrode of the first power semiconductor element and a second electrode of the second power semiconductor element. The common terminal that is connected to the first gate terminal through a first resistor and is connected to the second gate terminal through a second resistor.

9 Claims, 5 Drawing Sheets

(56) References Cited

U.S. PATENT DOCUMENTS

| | | | | |
|---|---|---|---|---|
| 3,614,531 A | * | 10/1971 | Oswald | H02H 9/005 |
| | | | | 361/84 |
| 4,423,387 A | * | 12/1983 | Sempel | G05F 3/262 |
| | | | | 330/288 |
| 6,288,597 B1 | * | 9/2001 | Hasegawa | H03K 17/0828 |
| | | | | 327/403 |
| 7,057,459 B2 | * | 6/2006 | Ueno | H03F 3/4521 |
| | | | | 330/255 |
| 9,781,775 B2 | * | 10/2017 | Jeanneteau | H02M 7/003 |
| 2012/0293270 A1 | * | 11/2012 | Zhang | G01R 31/2824 |
| | | | | 331/44 |
| 2014/0125645 A1 | * | 5/2014 | Ghaderi | G09G 3/006 |
| | | | | 345/87 |
| 2018/0159440 A1 | * | 6/2018 | Xu | H02M 1/32 |

\* cited by examiner

PRIOR ART

PRIOR ART

POWER SEMICONDUCTOR MODULE AND LEAKAGE CURRENT TEST METHOD FOR THE SAME

CROSS-REFERENCE TO RELATED APPLICATIONS

The present application claims priority from Japanese Patent Application No. 2019-129676, filed Jul. 11, 2019, the entire content of which is incorporated herein by reference.

TECHNICAL FIELD

The present invention relates to a power semiconductor module, and more particularly, to a power semiconductor module having a structure having two power MOSFET chips having drains connected to each other (a so-called 2-in-1 structure), and a method of performing a leakage current test on the vicinity of the gate of each power MOSFET mounted on the power semiconductor module, specifically, a leakage current test on an area between the gate and source of each power MOSFET.

BACKGROUND ART

There are known electric power converters such as full-bridge DC-to-DC converters using a phase shift system capable of implementing soft switching and suppressing switching loss. Some of this kind of electric power converters have transformers having circuit configurations including modules for synchronous rectification provided on their secondary sides. This kind of modules include, for example, two power MOSFET chips having drains connected to each other.

In such a module, when the electric power converter operates, the gate terminal which is connected to the gate of a power MOSFET may deviate from the predetermined fixation position due to bad soldering or the like, thereby getting into an offset state (open state). In this state, an excess voltage may be applied to the gate, resulting in an element breakdown in the power MOSFET. Or, an excess voltage applied to the gate may cause the power MOSFET to be erroneously switched on, resulting in a thermal breakdown of the power MOSFET. In order to prevent this, in general, a pull-down resistor is connected between the gate and source of each power MOSFET.

By the way, in a test for shipment which is performed on such a module, whether each power MOSFET mounted thereon is good is judged by applying a predetermined voltage between the gate and source of the power MOSFET and measuring a leakage current between the gate and source. However, since the resistance value of the pull-down resistor are smaller than the resistance value between the gate and source of the power MOSFET, the current flowing in the pull-down resistor becomes predominant over a leakage current between the gate and the source. In this situation, it becomes difficult to measure a leakage current between the gate and source of the power MOSFET. Therefore, there is a problem that it is impossible to judge whether the mounted power MOSFET is good.

This will be further described with reference to FIGS. 4 and 5. FIG. 4 is a circuit diagram illustrating a circuit configuration example of a power semiconductor module of the related art, and FIG. 5 is a diagram illustrating a measurement circuit and a current flowing therein on the occasion of performing leakage current measurement on the area between the gate and source of a power MOSFET mounted on the power semiconductor module of the related art shown in FIG. 4.

A description of parts of the configuration of FIG. 4 identical to those of the configuration of a power semiconductor module of the present invention shown in FIG. 1 to be described below will not be made, and pull-down resistors R1 and R2 are connected between the gate and source of a power MOSFET Q1 and between the gate and source of a power MOSFET Q2, respectively.

On the occasion of performing leakage current measurement on the area between the gate and source of a power MOSFET Q or Q2 mounted on the power semiconductor module having the above-mentioned configuration, a voltage source VGS for tests is connected between the gate and source of the power MOSFET Q as shown in FIG. 5 (FIG. 5 is a diagram illustrating the case of performing a test on the power MOSFET Q1) such that a predetermined voltage is applied between the gate and the source, and the current flowing from the voltage source VGS for tests to the gate is measured by an ammeter 2. By the way, if the drain of the power MOSFET Q1 is floated, it may exert an adverse influence on measurement. In order to prevent this, the source and drain of the power MOSFET Q1 is short-circuited.

However, in the configuration of the power semiconductor module of the related art, as described above, the current which is obtained by performing the leakage current test on the area between the gate and source inevitably becomes predominant over the current flowing in the pull-down resistor R1. Therefore, it is difficult to accurately measure a leakage current originally intended to be measured.

In order to solve this problem, a method of providing a switch for cutting off the connection between the pull-down resistor and the source as disclosed in Japanese Patent Application JP2013-13051 (a switch S3H or the like of FIG. 1) can be considered.

However, in the case of providing the switch inside the module, it is necessary to additionally provide a control terminal for the switch. In this case, the increase in the number of terminals increases the cost, and the size of the module increases. Therefore, a problem that it is impossible to meet the needs of recent years when modules have been becoming smaller occurs.

SUMMARY

The present invention was made to solve the problem of the technology of the related art, and an object of the present invention is to provide a power semiconductor module which makes it possible to accurately measure a leakage current between the gate and first electrode of each power semiconductor element mounted thereon and can protect each power semiconductor element even though the corresponding gate terminal gets into an open state, without causing an increase in the size and cost of the module.

A power semiconductor module including at least first and second power semiconductor elements, includes a first terminal, a first gate terminal, a second terminal, a second gate terminal, a third terminal and a common terminal. The first terminal connected to a first electrode of the first power semiconductor element. The first gate terminal connected to a gate of the first power semiconductor element. The second terminal connected to a first electrode of the second power semiconductor element. The second gate terminal connected to a gate of the second power semiconductor element. The third terminal connected to a second electrode of the first power semiconductor element and a second electrode of the second power semiconductor element. The common terminal that is connected to the first gate terminal through a first resistor and is connected to the second gate terminal through a second resistor.

According to the present invention, it becomes possible to provide the power semiconductor module which makes it possible to measure a leakage current between the gate and first electrode of each power semiconductor element mounted thereon and can protect each power semiconductor element even though the corresponding gate terminal gets into the open state, without causing an increase in the size and cost of the module.

DETAILED DESCRIPTION OF EMBODIMENTS

Hereinafter, an embodiment of the present invention will be described in detail with reference to the drawings. A power semiconductor module according to the embodiment of the present invention is a power semiconductor module applicable to the secondary side of a transformer included in an electric power converter such as a phase-shifted full-bridge DC-to-DC converter, and is a power semiconductor module for synchronous rectification.

(Basic Configuration)

First of all, the basic configuration of the power semiconductor module according to the embodiment of the present invention will be described with reference to FIG. 1.

Figure 1:
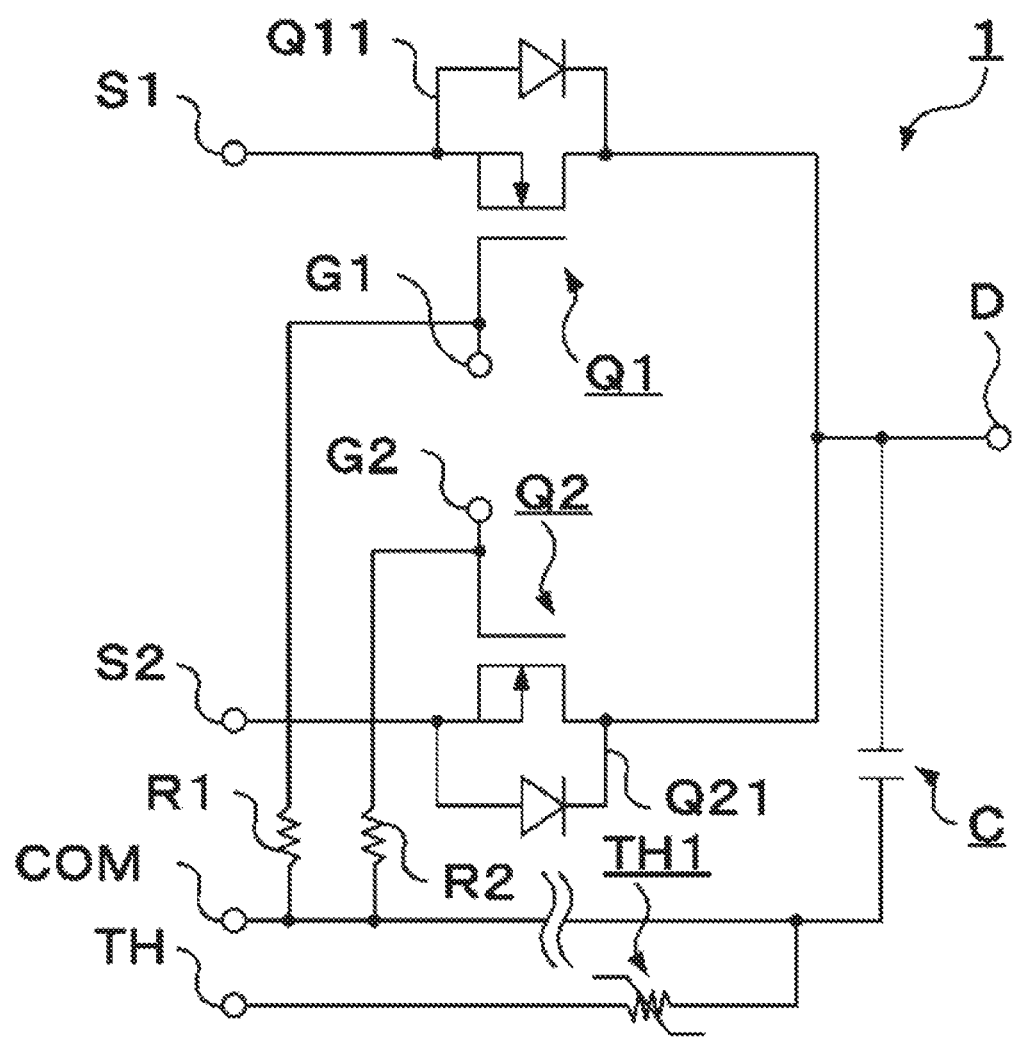
FIG. 1 is a circuit diagram illustrating the circuit configuration of a power semiconductor module according to an embodiment of the present invention.

As shown in FIG. 1, a power semiconductor module 1 is configured to include power MOSFETs Q1 and Q2 and pull-down resistors R1 and R2. Also, the power semiconductor module 1 includes a first source terminal S1, a second source terminal S2, a common terminal COM, a thermistor terminal TH, a first gate terminal G1, a second gate terminal G2, and a drain terminal D, as external terminals.

For example, the individual power MOSFETs Q1 and Q2 are power semiconductor chips which are mounted on the same substrate. The power MOSFETs Q1 and Q2 are N-type (N-channel) power MOSFETs. The power MOSFETs Q1 and Q2 include body diodes (freewheeling diodes) Q1 and Q21 connected so as to be antiparallel, respectively.

The source, gate, and drain of the power MOSFET Q1 are connected to the first source terminal S1, the first gate terminal G1, and the drain terminal D, respectively. Similarly, the source, gate, and drain of the power MOSFET Q2 are connected to the second source terminal S2, the second gate terminal G2, and the drain terminal D, respectively. In other words, the drains of the power MOSFETs Q1 and Q2 are connected to the drain terminal D in common.

The power MOSFETs Q1 and Q2 are turned on and off by voltage signals which are supplied from gate drivers (although they are not shown in FIG. 1, they will be described when the circuit configuration when the user uses them is described) provided outside the power semiconductor module 1 to their gate terminals G1 and G2, respectively.

The pull-down resistors R1 and R2 are provided to protect the gates of the power MOSFETs Q1 and Q2 and protect the power MOSFETs Q1 and Q2 when excess voltages are applied to the gates. Specifically, after the power semiconductor module 1 is assembled with (connected to) the electric power converter by the user, i.e. the user required to apply the power semiconductor module 1 to the secondary side of the transformer of the electric power converter such as a DC-to-DC converter, when the electric power converter including the power semiconductor module 1 is operating, if the first gate terminal G1 or the second gate terminal G2 deviates from the predetermined fixation position due to bad welding or the like, thereby getting into an offset state (open state), since the offset state is unstable, for example, the corresponding gate terminal may serve as a noise antenna, so an excess voltage may be applied to the gate of the power MOSFET Q1 or Q2. The pull-down resistors R1 and R2 protect the gates of the power MOSFETs Q1 and Q2 from such excess voltages.

One end of the pull-down resistor R1 is electrically connected to the first gate terminal G1, and the other end is electrically connected to the common terminal COM. Similarly, one end of the pull-down resistor R2 is electrically connected to the second gate terminal G2, and the other end is electrically connected to the common terminal COM. Since the pull-down resistors R1 and R2 are connected to the secondary coil side of the transformer of the electric power converter such as a DC-to-DC converter as will be described below in detail, it is desirable that they should be resistant to voltage which is generated on the secondary coil of the transformer.

Of the external terminals, the common terminal COM is electrically connected to the drain terminal D through a snubber capacitor C. The common terminal COM is grounded when the power semiconductor module 1 is used by the user. In other words, the common terminal COM is not grounded at the time when the power semiconductor module 1 has been manufactured. Also, the common terminal can also be connected to one end of a thermistor TH1 for temperature measurement. The other end of the thermistor TH1 is connected to the thermistor terminal TH, and this thermistor terminal TH is connected to an external measuring device (not shown in the drawings). The connection relations of the other terminals will be described below.

An example of a method of manufacturing the power semiconductor module 1 will be described. First, a predetermined circuit pattern (wiring pattern) is printed on an insulated aluminum substrate by photolithography, CVD, or the like.

Next, on the insulated aluminum substrate, the chips of the power MOSFETs Q1 and Q2, the chips of the resistors R1 and R2, the snubber capacitor C, and the thermistor TH1 are disposed at predetermined positions and are mounted by soldering.

Subsequently, the insulated aluminum substrate is bonded to a case (a so-called terminal case) with a lead frame formed of copper in a polyphenylene sulfide (PPS) resin by insert molding, with an adhesive.

Next, the terminal case and the insulated aluminum substrate are electrically connected with aluminum wire by ultrasonic joining, whereby the circuit configuration including the first source terminal S1, the second source terminal S2, the common terminal COM, the thermistor terminal TH, and the drain terminal D as shown in FIG. 1 is formed.

Finally, the intermediate product is wholly sealed with a cast resin which is a thermosetting resin, whereby the power semiconductor module 1 is formed.

(Circuit Configuration During Test for Shipment)

Figure 2:
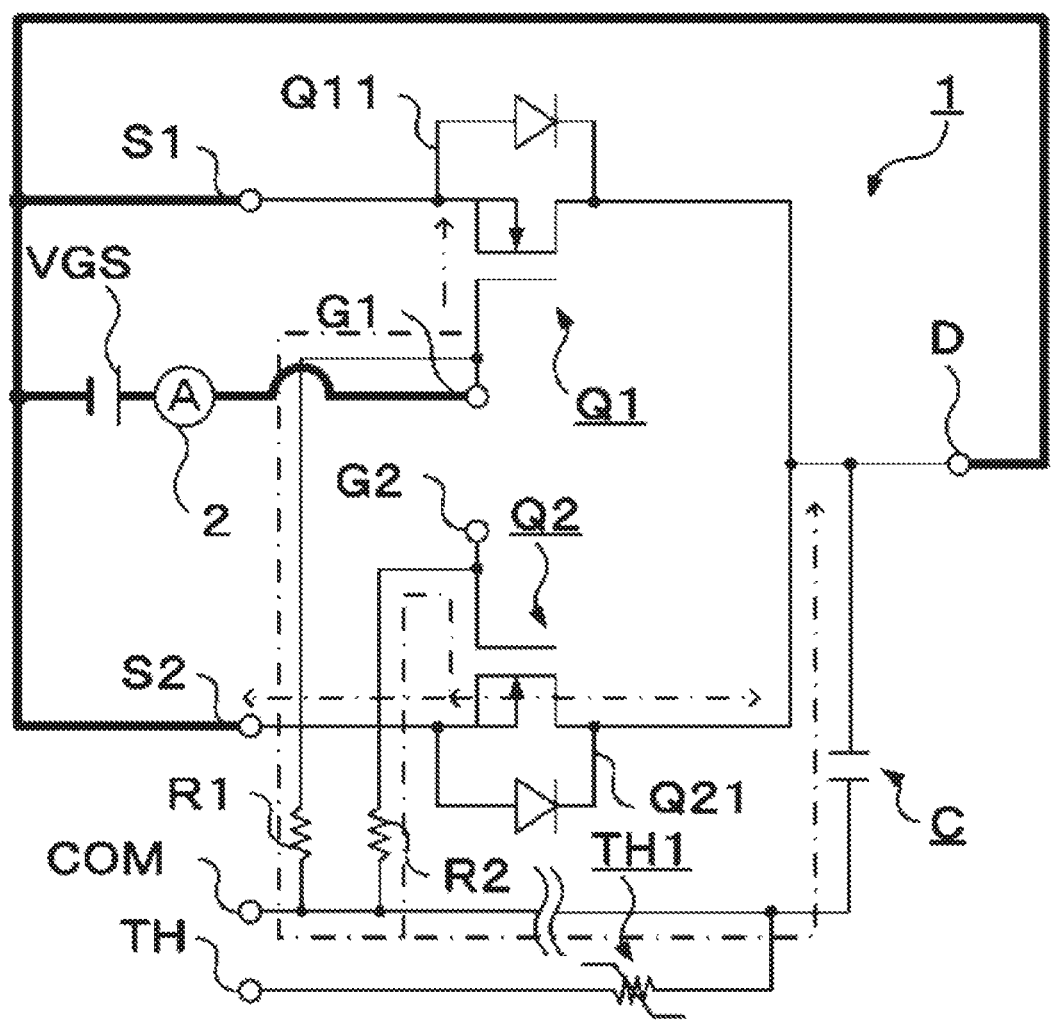
FIG. 2 is a circuit diagram illustrating the circuit configuration of the power semiconductor module and a current which flows therein during a test for shipment.

Now, the circuit configuration of the power semiconductor module 1 having the above-mentioned configuration during a test for shipment will be described with reference to FIG. 2. In FIG. 2, thick lines indicate circuit parts which are formed by a tester during the test. As one of various tests which are performed before shipping the power semiconductor module 1, leakage currents in the vicinities of the power MOSFET Q1 and Q2, specifically, leakage currents between the gates and the sources are measured. Here, the case of measuring a leakage current between the gate and source of the power MOSFET Q1 will be mainly described as an example.

In order to measure a leakage current between the gate and source of the power MOSFET Q1, in this test, the tester is applied to the power semiconductor module 1. As shown in FIG. 2, the tester includes a voltage source VGS for tests which applies a predetermined voltage to the gate of the power MOSFET Q1. The negative electrode side of the voltage source for tests is connected to the first source terminal S1, the second source terminal S2, and the drain terminal D through individual probes of the tester or a socket for tests. The positive electrode side of the voltage source VGS for tests is connected to one end of the ammeter 2 of the tester. The other end of the ammeter 2 is connected to the first gate terminal G1. During this test, the common terminal COM is open. In other words, the common terminal is not electrically connected to any probe of the tester.

In this circuit configuration, the tester is set to a voltage application mode (for the gate terminal G1), and the voltage value of the voltage source VGS for tests is set to a predetermined value. When the voltage is applied from the voltage source VGS for tests to the gate terminal G1, currents other than a current flowing to the gate of the power MOSFET Q1 (as shown by an alternate long and two short dashes line in FIG. 2) can flow in two current pathways shown by alternate long and short dash lines in FIG. 2. Specifically, a first current pathway is a current pathway from the first gate terminal G1 to the source and drain of the power MOSFET Q2. i.e. to the second source terminal S2 and the drain terminal D through the pull-down resistor R1, the pull-down resistor R2, and the second gate terminal G2. A second current pathway is a current pathway from the first gate terminal G1 to the drain terminal D through the pull-down resistor R1 and the snubber capacitor C.

Figure 4:
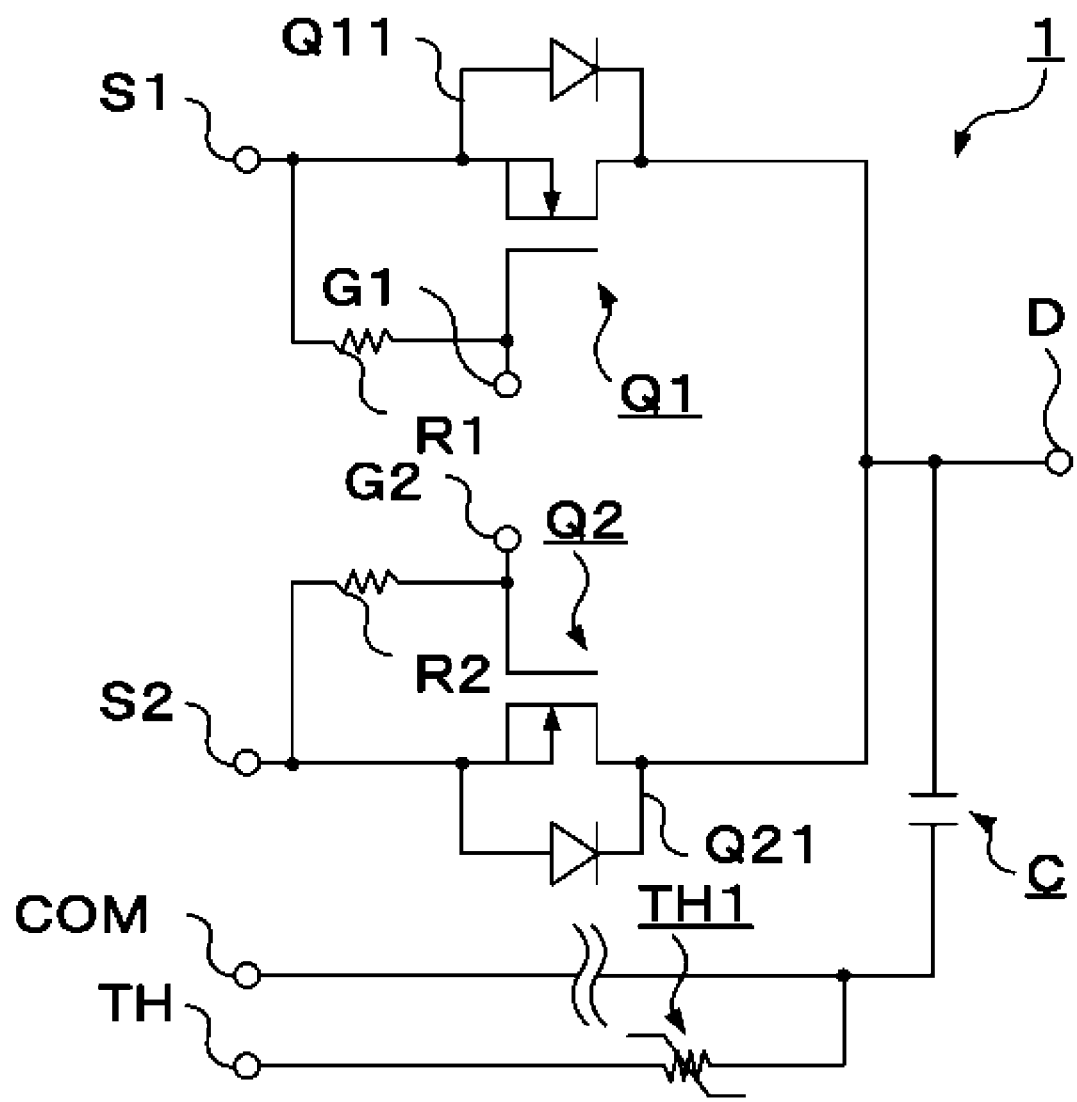
FIG. 4 is a circuit diagram illustrating a circuit configuration example of a power semiconductor module of the related art.
Figure 5:
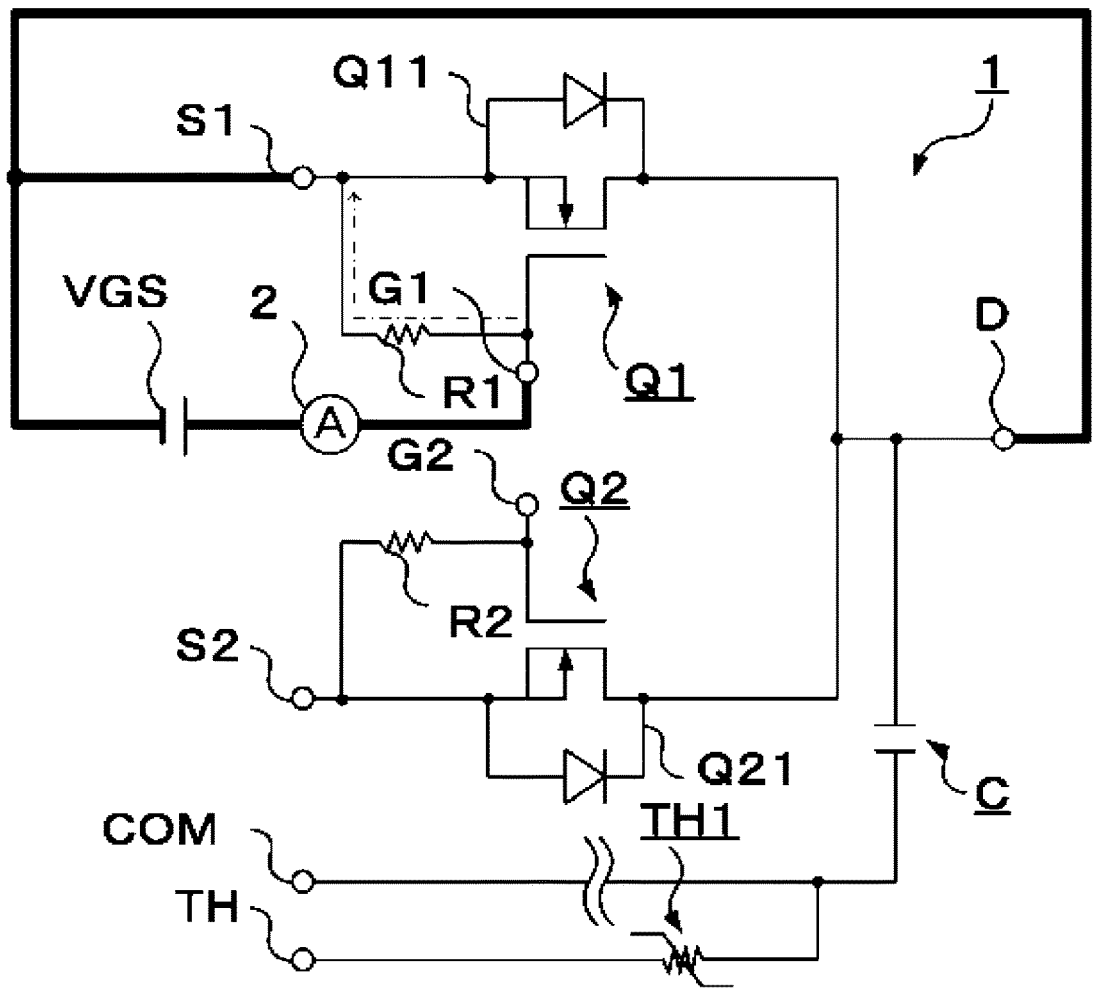
FIG. 5 is a circuit diagram illustrating a measurement circuit and a current on the occasion of performing leakage current measurement on the area between the gate and source of a power MOSFET mounted on the power semiconductor module of the related art shown in FIG. 4.

In this case, the currents flowing in the first current pathway passing through the pull-down resistors R1 and R2 and the second current pathway passing through the pull-down resistor R1 are sufficiently smaller than a current flowing in a current pathway passing through a pull-down resistor R1 connected between a first source terminal S1 and a first gate terminal G1 (as shown by an alternate long and short dash line in FIG. 5) in an example of the related art shown in FIG. 4 and FIG. 5. The reason is that on the first current pathway, there are gate capacitors formed by the oxide films, metal films, and so on of the gates of the power MOSFETs Q1 and Q2, and on the second current pathway, there is the snubber capacitor C.

In other words, according to the circuit configuration of the present embodiment, in measuring the leakage current between the gate and the source, the currents other than the leakage current between the gate and the source originally intended to be measured can be made much smaller than the current flowing in the pull-down resistor of the example of the related art. Therefore, as compared to the example of the related art, since the influence of the pull-down resistor R1 is excluded, it becomes possible to measure a smaller leakage current between the gate and source of the power MOSFET Q1. Therefore, it is possible to accurately judge whether the mounted power MOSFET Q1 is good.

Next, the tester is set to a current measurement mode, and the sum of the flowing from the first gate terminal G1 to the gate of the power MOSFET Q1 current (as shown by the alternate long and two short dashes line in FIG. 2) and the currents flowing in the above-mentioned two current pathways (as shown by the alternate long and short dash lines in FIG. 2) is measured by the ammeter 2 of the tester connected to the voltage source VGS for tests. On the basis of this measured current value, whether the power MOSFET is good is judged. In other words, whether there is any leakage current between the gate and source of the power MOSFET Q1 is determined by applying the predetermined voltage from the voltage source VGS for tests to the first gate terminal G1 and measuring the current flowing in the gate terminal G1. In the case where there is no defect around the gate of the power MOSFET Q1, and there is no leakage current between the gate and the source, the current value smaller than a predetermined value is measured by the ammeter 2. In the case where there is a leakage current between the gate and the source, since a current value larger than the predetermined value is measured by the ammeter 2, it is possible to determine that there is a leakage current between the gate and source of the power MOSFET Q1.

By the way, according to the circuit configuration during the test shown in FIG. 2, although it is possible to detect a leakage current attributable to defects existing around the gate of the power MOSFET Q2 on the basis of the currents shown by the alternate long and short dash lines, in the case where the leakage current is excessively large, it is difficult to distinguish between a leakage current attributable to defects existing around the gate of the power MOSFET Q1 and a leakage current attributable to defects existing around the gate of the power MOSFET Q2. In this case, if the voltage source VGS for tests and the ammeter 2 are connected to the second gate terminal G2 such that the predetermined voltage is applied from the voltage source VGS for tests to the second gate terminal G2, and other connection relations of the tester are appropriately changed, it is possible to separately measure or detect the leakage current attributable to defects existing around the gate of the power MOSFET Q1 and the leakage current attributable to defects existing around the gate of the power MOSFET Q2.

As an example, in the case where the resistance values of the pull-down resistors R1 and R2 are 5Ω, and the voltage value of the voltage source VGS for tests is set to 20 V in the tester, in the circuit configuration for a test on the power semiconductor module of the related art shown in FIG. 5, since it is necessary to exclude the current value of about 4 mA flowing in the pull-down resistor from the current value read out from the ammeter 2 in order to detect a leakage current, the accuracy of leakage current detection ineluctably decreases. In contrast with this, in the case of the present embodiment, it is possible to make the accuracy of leakage current detection equal to or smaller than 1 µA.

(Circuit Configuration when User Uses Power Semiconductor Module)

Figure 3:
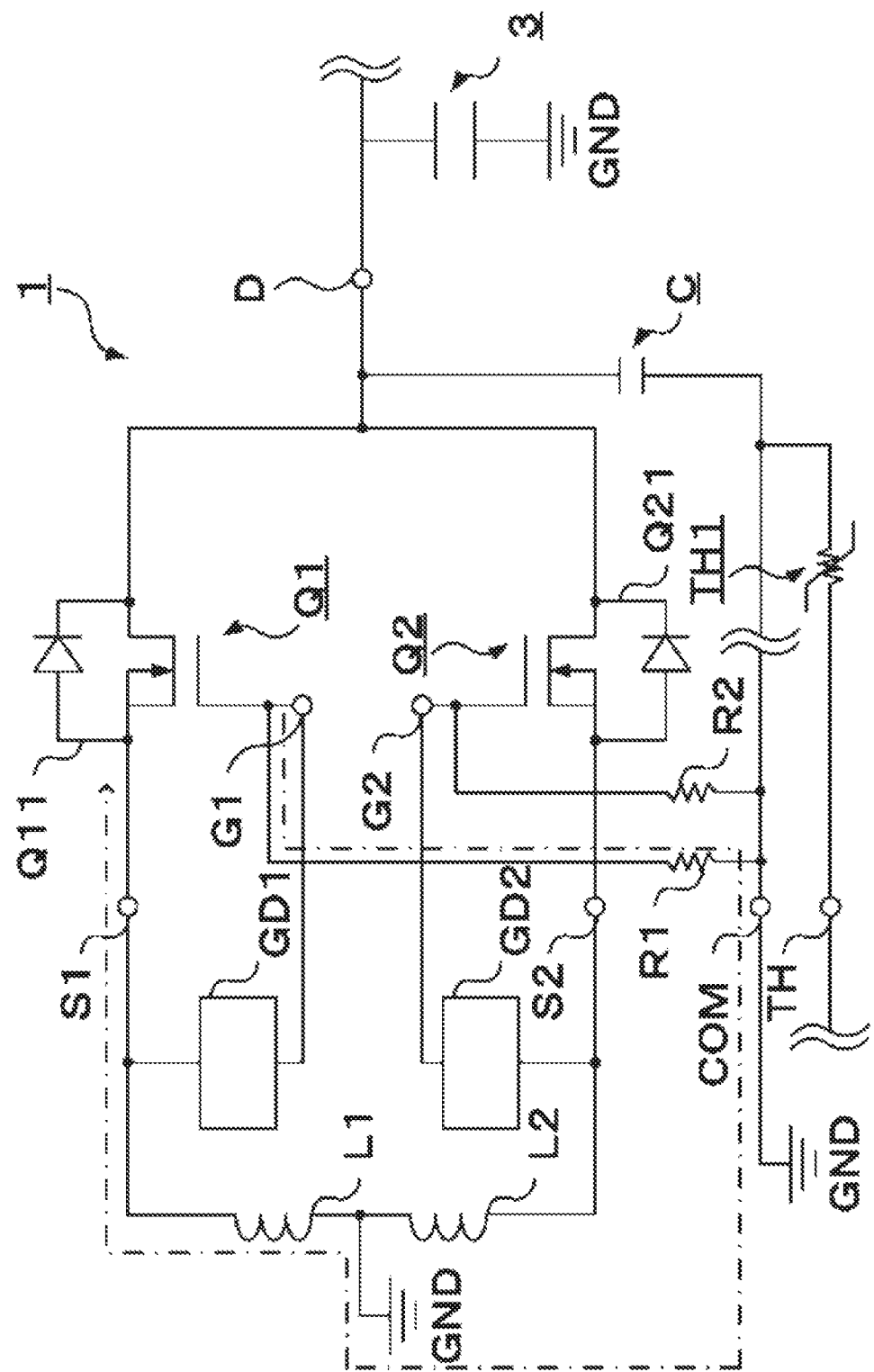
FIG. 3 is a circuit diagram illustrating the circuit configuration of the power semiconductor module and some constituent elements of an electric power converter when a user uses them.

Now, the circuit configuration when the user has applied the power semiconductor module 1 to the secondary side of the transformer of the electric power converter such as a DC-to-DC converter will be described with reference to FIG. 3. FIG. 3 is a diagram illustrating only the secondary side of the transformer of the electric power converter, and does not show the core of the transformer and the circuit on the primary side of the transformer. Also, the case where the secondary coil of the transformer consists of a first secondary coil L1 and a second secondary coil L2 is taken as an example. In this case, the first source terminal S1 is connected to one end of the first secondary coil L1 of the transformer. Also, the second source terminal S2 is connected to one end of the second secondary coil L2 of the transformer. The other ends of the first and second secondary coils L1 and L2 are grounded.

In this configuration, according to the direction in which the voltage is applied to the primary side of the transformer, the one end of the first secondary coil L1 and the one end of the second secondary coil L2, i.e. both ends of the secondary coil of the transformer alternately have a positive voltage (when one end has the positive voltage, the other end has a negative voltage). The positive voltage generated on one of both ends of the secondary coil of the transformer is supplied to an output capacitor 3 through the power MOSFET Q1 and the body diode Q11 or through the power MOSFET Q2 and the body diode Q21.

The first gate terminal G1 is connected to an output terminal of a first gate driver GD1 configured to generate a voltage signal for turning on and off the power MOSFET Q, according to an external control signal. Also, a reference voltage terminal of the first gate driver GD1 is connected between the first source terminal S1 and the first secondary coil L1. Similarly, the second gate terminal G2 is connected to an output terminal of a second gate driver GD2. A reference voltage terminal of the second gate driver GD2 is connected between the second source terminal S2 and the second secondary coil L2.

With respect to this configuration of the gate driver GD1 and the like, in order to obtain reference voltages for generating gate-source voltages which are predetermined voltages for turning on the power MOSFET Q1 and the like and applying the generated voltages to the first gate terminal G1 and the like, the reference voltage terminals are connected to the first source terminal S1 and the like. However, the present invention is not limited to this configuration. The gate driver GD1 or the like may be configured to turn on the power MOSFET Q1 or the like if detecting that the voltage of the first source terminal S1 or the like has become positive.

The common terminal COM is grounded. In other words, if the power semiconductor module 1 is assembled with the electric power converter by the user, the common terminal COM serves as a terminal of the low potential side of the high potential side and low potential side of the output stage of the electric power converter.

The drain terminal D is connected to one end of the output capacitor 3 of the electric power converter. The other end of the output capacitor 3 is grounded. The voltage of the output capacitor 3 is supplied as the output voltage from the electric power converter to an external device. Examples of the external device include personal computers and portable-phone charging circuits; however, the present invention is not limited thereto.

Now, the case where any one of the first gate terminal G and the second gate terminal G2 in the above-described circuit configuration gets into an open state will be described. As an example, the case where the first gate terminal G1 deviates from the predetermined fixation position due to bad soldering, thereby getting into the open state, when the power semiconductor module 1 is operating after having been assembled with the electric power converter by the user will hereinafter be described.

If the first gate terminal G1 gets into the open state, it is feared that an excess voltage will be applied to the gate of the power MOSFET Q1 as in the power semiconductor module of the related art. By the way, the gate of the power MOSFET Q1 can be considered as being electrically connected to the source of the power MOSFET Q1 through the pull-down resistor R1, the grounded common terminal COM, and the grounded end of the first secondary coil L1 of the transformer as shown by the alternate long and short dash line in FIG. 3. Therefore, even though the first gate terminal G1 gets into the open state, any excess voltage cannot be applied between the gate and source of the power MOSFET Q1. Therefore, even though the open state occurs, it is possible to protect the power MOSFET Q from excess voltages. Also, since it is possible to restrain the power MOSFET Q1 from being erroneously turned on by an excess voltage, it is possible to restrain a thermal breakdown of the power MOSFET Q1 from being caused by an excess voltage.

Since the same is true for the power MOSFET Q2, even though the second gate terminal G2 gets into the open state, the gate of the power MOSFET Q2 can be considered as being connected to the source of the power MOSFET Q2 through the pull-down resistor R2, the grounded common terminal COM, and the grounded negative electrode side of the second secondary coil L2 of the transformer.

(Effects)

According to the embodiment of the present invention described above, the following effects are obtained.

(1) A power semiconductor module 1 of the present embodiment including at least first and second power semiconductor elements (Q1, Q2) includes a first terminal (S1) connected to a first electrode (source) of the first power semiconductor element (Q1), a first gate terminal G1 connected to a gate of the first power semiconductor element (Q1), a second terminal (S2) connected to a first electrode (source) of the second power semiconductor element (Q2), a second gate terminal G2 connected to a gate of the second power semiconductor element (Q2), a third terminal (D) connected to a second electrode (drain) of the first power semiconductor element (Q1) and a second electrode (drain) of the second power semiconductor element (Q2), and a common terminal (COM) connected to the first gate terminal G1 through a first resistor R1 and connected to the second gate terminal G2 through a second resistor R2.

If this configuration is used, when a test for shipment is performed on the power semiconductor module 1, as described above, it becomes possible to measure a leakage current between the gate and source of the power semiconductor element Q1 or the like, without being influenced by the resistors R1 and R2, and it becomes easy to judge whether the power semiconductor element Q1 or the like mounted on the power semiconductor module 1 is good. Also, if the first and second resistors R1 and R2 are connected and disposed as described above, as compared to the technology of the related art requiring the switch as disclosed in Japanese Patent Application JP2013-13051, and other technologies, any switch control terminal is unnecessary. Therefore, it is possible to prevent the size of the module from increasing.

(2) The first and second power semiconductor elements are insulated gate type power semiconductor devices, for example, the power MOSFETs Q1 and Q2, and during a gate-source leakage current test on the power semiconductor module 1, the common terminal COM is set to an open state.

According to this circuit configuration for tests, when a test for shipment is performed on the power semiconductor module 1, as compared to the configuration in which the resistor R1 or the like is connected between the gate and source of the power semiconductor element Q1 or the like, it is possible to significantly reduce currents other than a leakage current between the gate and source originally intended to be measured. Therefore, it is possible to more accurately perform gate-source leakage current measurement.

(3) The power semiconductor module 1 is connected to the secondary side of a transformer included in an electric power converter, and the electric power converter is a DC-to-DC converter, and in the electric power converter, the power semiconductor module 1 is connected as a circuit for synchronous rectification to the secondary side of the transformer of the DC-to-DC converter, and the first terminal (S1) is connected to one end of a secondary coil L1 of the transformer, and the second terminal (S2) is connected to the other end of a secondary coil L2 of the transformer, and the common terminal COM is grounded.

If this circuit configuration is used, when the DC-to-DC converter operates, even though, for example, the first gate G1 deviates from the predetermined fixation position, thereby getting into an offset state (open state), so it feared that an excess voltage will be applied to the first gate G1, since the first gate G can be considered as being electrically connected to the source 1 through the resistor R1, the grounded common terminal COM, and the first secondary coil L1 having one end grounded and another end connected to the source S1, the potential of the gate G1 does not vary. Therefore, it is possible to prevent the power MOSFET Q1 from being erroneously turned on.

(4) Also, according to the power semiconductor module 1, the DC-to-DC converter may be a phase-shifted full-bridge DC-to-DC converter, and it is desirable that the first resistor R1 and the second resistor R2 should be resistant to voltages which are generated on the secondary coils L1 and L2 of the transformer during the operation of the DC-to-DC converter, respectively. Further, the power semiconductor module may include a snubber capacitor C connected between the third terminal (D) and the common terminal COM. Also, the power semiconductor module may further include a thermistor TH1 having one end connected to the common terminal COM and another end connected to another end of the thermistor.

(5) A leakage current test method according to the present embodiment is a leakage current test method of performing a leakage current test on an area between the gate and first electrode (source) of each of first and second power semiconductor elements (Q, Q2) constituting a power semiconductor module 1 to constitute an electric power converter before the power semiconductor module 1 is connected to the electric power converter, wherein the power semiconductor module 1 includes a first terminal (S1) connected to the first electrode (source) of the first power semiconductor element (Q), a first gate terminal G1 connected to the gate of the first power semiconductor element (Q1), a second terminal (S2) connected to the first electrode (source) of the second power semiconductor element (Q2), a second gate terminal G2 connected to the gate of the second power semiconductor element (Q2), a third terminal (D) connected to a second electrode (drain) of the first power semiconductor element (Q1) and a second electrode (drain) of the second power semiconductor element (Q2), and a common terminal (COM) connected to the first gate terminal G1 through a first resistor R1 and connected to the second gate terminal G2 through a second resistor R2, and the leakage current test method sets the common terminal COM to an open state, and connects the positive electrode of a voltage source VGS for tests included in a tester to the first gate terminal G1 or the second gate terminal G2, and connects the first, second, and third terminals (S1, S2, D) to the negative electrode of the voltage source for tests, and measures the current value of a current flowing when a predetermined voltage is applied from the voltage source VGS for tests to the first gate terminal G1 or the second gate terminal G2, thereby determining pass or fail in the leakage current test.

According to this measurement method, as described above, it is possible to exclude the information the resistor R1. Therefore, as compared to the technologies of the related art, it becomes possible to accurately measure a leakage current between the gate and source of the power MOSFET Q1 or the like, and it becomes easy to determine whether power MOSFET Q or the like mounted is good.

However, it is apparent to those skilled in the art that the present invention is not limited to the above-described embodiment and various modifications and changes can be made to the above-described embodiment without departing from the technical scope of the present invention. The embodiment and the modifications thereof are included in the technical scope of the present invention, and are also included in the scope of claims and their equivalents.

For example, in the above-described embodiment, the configuration using the power MOSFETs Q1 and Q2 has been described as an example. However, the present invention is not limited to this example, and can use other kinds of insulated gate type power semiconductor devices (elements). Specifically, for example, in the case where it is desired to apply the configuration of the present invention for the purpose of larger power capacity, instead of the power MOSFET Q1 and so on, IGBTs may be used.

What is claimed is:

1. A power semiconductor module including at least first and second power semiconductor elements, comprising:
   a first terminal connected to a first electrode of the first power semiconductor element;
   a first gate terminal connected to a gate of the first power semiconductor element;
   a second terminal connected to a first electrode of the second power semiconductor element;
   a second gate terminal connected to a gate of the second power semiconductor element;
   a third terminal connected to a second electrode of the first power semiconductor element and a second electrode of the second power semiconductor element; and
   a common terminal that is connected to the first gate terminal through a first resistor and is connected to the second gate terminal through a second resistor.

2. The power semiconductor module according to claim 1, wherein the first and second power semiconductor elements are insulated gate type power semiconductor devices, and wherein in a gate-source leakage current test on the power semiconductor module, the common terminal is set to an open state.

3. The power semiconductor module according to claim 1, wherein the power semiconductor module is connected to the secondary side of a transformer included in an electric power converter.

4. The power semiconductor module according to claim 3, wherein the electric power converter is a DC-to-DC converter, and
wherein in the electric power converter,
the power semiconductor module is connected as a circuit for synchronous rectification to the secondary side of the transformer of the DC-to-DC converter, and
the first terminal is connected to one end of a secondary coil of the transformer, and the second terminal is connected to the other end of the secondary coil of the transformer, and
the common terminal is grounded.

5. The power semiconductor module according to claim 4, wherein the DC-to-DC converter is a phase-shifted full-bridge DC-to-DC converter.

6. The power semiconductor module according to claim 4, wherein each of the first resistor and the second resistor are resistant to voltage which is generated on the secondary coil of the transformer during the operation of the DC-to-DC converter.

7. The power semiconductor module according to claim 3, further comprising a snubber capacitor connected between the third terminal and the common terminal.

8. The power semiconductor module according to claim 1, further comprising:
a thermistor having one end connected to the common terminal; and
a thermistor terminal connected to another end of the thermistor.

9. A leakage current test method of performing a leakage current test on an area between the gate and first electrode of each of first and second power semiconductor elements constituting a power semiconductor module to constitute an electric power converter before the power semiconductor module is connected to the electric power converter,
wherein the power semiconductor module includes:
a first terminal connected to the first electrode of the first power semiconductor element;
a first gate terminal connected to the gate of the first power semiconductor element;
a second terminal connected to the first electrode of the second power semiconductor element;
a second gate terminal connected to the gate of the second power semiconductor element;
a third terminal connected to a second electrode of the first power semiconductor element and a second electrode of the second power semiconductor element; and
a common terminal that is connected to the first gate terminal through a first resistor and is connected to the second gate terminal through a second resistor, and
wherein the leakage current test method comprises:
setting the common terminal to an open state;
connecting a positive electrode of a voltage source for tests included in a tester to the first gate terminal or the second gate terminal;
connecting the first, second, and third terminals to a negative electrode of the voltage source for tests; and
measuring, by an ammeter, the current value of a current flowing when a predetermined voltage is applied from the voltage source for tests to the first gate terminal or the second gate terminal.

* * * * *